Oct. 27, 1970 N. R. BAUM ET AL 3,537,025
UNITARY CIRCUIT FOR CLAMPING, AMPLIFICATION
AND AUTOMATIC GAIN CONTROL
Filed Nov. 6, 1967
FIG. 1
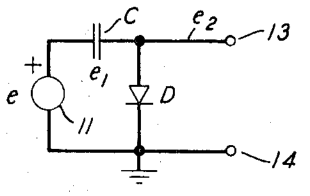
FIG. 2
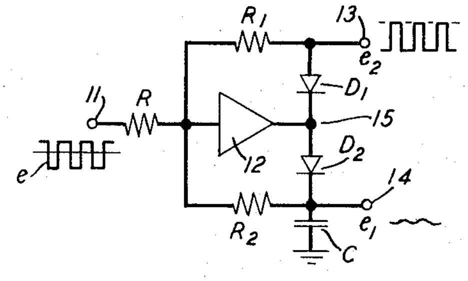
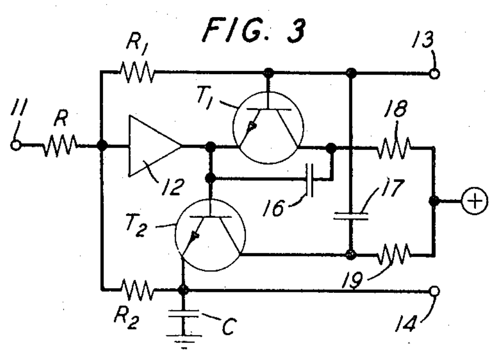
FIG. 4
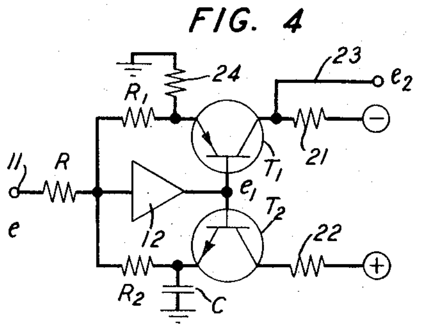
FIG. 5
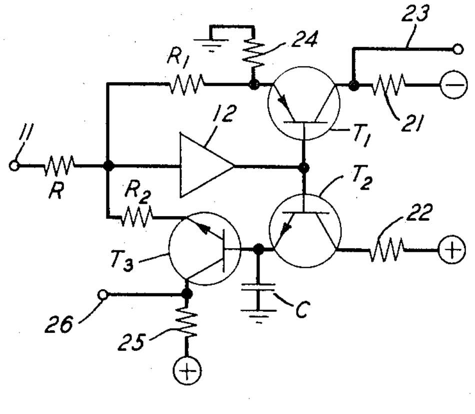
FIG. 6
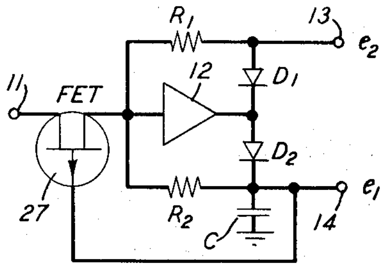
FIG. 7
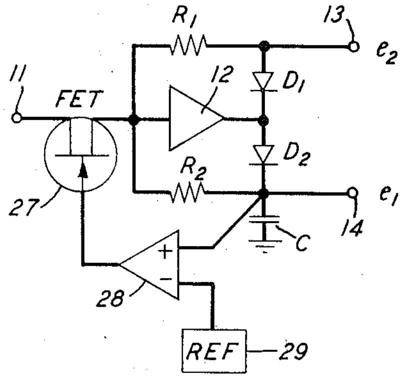
FIG. 8
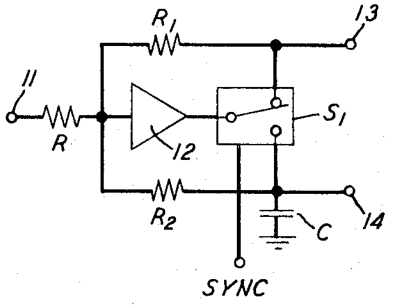
N. R. BAUM
INVENTORS: S. C. KITSOPOULOS
D. E. LYNN
BY G. E. Hirsch Jr.
ATTORNEY United States Patent Office 3,537,025
Patented Oct. 27, 1970

3,537,025

UNITARY CIRCUIT FOR CLAMPING, AMPLIFICATION AND AUTOMATIC GAIN CONTROL

Nicholas R. Baum, Laurence Harbor, Sotirios C. Kitsopoulos, Summit, and Dale E. Lynn, Eatontown, N.J., assignors to Bell Telephone Laboratories, Incorporated, Murray Hill and Berkeley Heights, N.J., a corporation of New York Filed Nov. 6, 1967, Ser. No. 680,877
Int. Cl. H03r *1/34;* W03f *3/00*
U.S. Cl. 330—103 11 Claims

ABSTRACT OF THE DISCLOSURE

A clamping circuit, which comprises an amplifier selectively connected to two feedback branches and a storage element, is utilized simultaneously to clamp and amplify an applied signal. Automatic gain control is effected by a voltage controlled variable resistor, such as a field effect transistor, at the input of the amplifier, responsive to the voltage developed by the storage element.

BACKGROUND OF THE INVENTION

Field of the invention

This invention pertains to signal level control apparatus and, more particularly, to apparatus for clamping an applied waveform to a reference level.

Description of the prior art

Conventional clamping circuits, also known as DC restoration circuits, basically comprise the serial connection of a signal source, capacitor and diode rectifier. In a manner well known to those skilled in the art, the maximum excursions of an applied input signal are restricted to a predetermined reference level, i.e., they are clamped, by the joint effect of a diode conduction and capacitor storage. However, due to the nonlinear characteristics exhibited by diodes, particularly in the presence of small driving voltages, the conventional clamping circuit does not ideally clamp the applied signal but, rather, introduces nonlinear perturbations. In order to overcome this limitation, the applied signal must be amplified to a voltage level much higher than the diode drop, prior to application to the clamp circuit.

Furthermore, the applied signal is, in the best case, merely translated, without effecting a change in its overall magnitude, i.e., it is not amplified by the clamp circuit; indeed, the signal may, in some cases, suffer a reduction in magnitude. In addition, the conventional clamp circuit has a time varying input impedance and its operation is drastically affected by the presence of an output load impedance. Also, it is well known that, in conventional clamp circuits using diodes as switching elements, a time lag occurs between the application of a signal to the diode and response by the diode, due to its semiconductor composition.

Moreover, it has been common practice, particularly in video systems, to amplify the clamped signal prior to its application to a cathode ray tube or other driven apparatus. The use of an auxiliary circuit to achieve this purpose necessitates larger system packages where, in the usual case, space commands a premium. Related to the use of auxiliary circuits is the practice of using separate circuitry to achieve automatic gain control (AGC). Again, the use of additional circuitry is both inefficient and wasteful of space. Faced with these limitations, the designer of modern electronic systems, particularly video systems, finds himself at a serious disadvantage.

It is, therefore, an object of this invention to accurately clamp an applied video waveform to a reference level.

It is another object of this invention to linearize the operating characteristics of clamping circuits which use diodes as switching elements.

It is, yet, another object of this invention to substantially reduce the time lag exhibited by clamping circuits.

Still, it is another object of this invention to simultaneously clamp and amplify an applied signal so as to obviate the need for auxiliary circuits.

It is a further object of this invention to simultaneously clamp, amplify, and effect automatic gain control of an applied signal without resort to auxiliary circuits.

SUMMARY OF THE INVENTION

These and other objects are accomplished, in accordance with the inventive principles described herein, by the use of a high gain, direct coupled amplifier, such as an operational amplifier, shunted by two feedback branches, each including a diode and a resistive element. A capacitor, connected to the junction of a diode and resistive element of one of the branches, is charged to a voltage proportional to the peak amplitude of a signal applied to the input of the amplifier. At the junction of the resistive element and diode of the other branch there is available a clamped, amplified facsimile of the applied signal. Automatic gain control is accomplished, simultaneously, by controlling a variable resistor, e.g., a field effect transistor, at the input of the amplifier, with the proportional signal developed across the capacitor.

In another embodiment of this invention, the time lag exhibited by switching diodes is substantially reduced by the use of two transistors, coupled by one or more capacitive devices, in place of the diodes in the feedback paths around the operational amplifier.

In yet another embodiment of this invention, a novel transistor arrangement is utilized, in place of the switching diodes, to effect a substantial gain in the magnitude of the clamped signal without resort to auxiliary amplifier circuits.

These and further features and objects of this invention, its nature and various advantages, will be readily apparent upon consideration of the attached drawings and of the following detailed description of the drawings.

BRIEF DESCRIPTION OF THE DRAWINGS

In the drawings:

FIG. 1 is a schematic circuit diagram of a conventional clamping circuit;

FIG. 2 is a schematic circuit diagram of a clamping circuit in accordance with this invention;

FIG. 3 is a schematic circuit diagram which illustrates the clamping circuit of this invention wherein switching time lag is substantially reduced;

FIG. 4 is a schematic circuit diagram of a clamping circuit, in accordance with this invention, wherein the illustrated circuit functions, simultaneously, as a clamping circuit and a driver amplifier for connected apparatus;

FIG. 5 is a schematic circuit diagram which shows a clamping circuit, in accordance with this invention, wherein a signal proportional to the average value of a clamped signal may be sensed without impairing the clamping operation of the circuit;

FIG. 6 is a schematic circuit diagram of an embodiment of this invention which simultaneously clamps, amplifies and provides automatic gain control;

FIG. 7 is a schematic circuit diagram which illustrates an embodiment of this invention which simultaneously clamps, amplifies and adjusts the average value of the clamped signal to a predetermined reference voltage; and FIG. 8 illustrates a synchronous clamping circuit in accordance with this invention.

DETAILED DESCRIPTION OF THE INVENTION

A conventional clamping or DC restoration circuit is illustrated in FIG. 1. Basically, it comprises the serial connection of a low impedance signal source 11, a capacitor C and a diode rectifier D. Ideally, rectifier D prevents the output voltage $e_2$ from becoming positive, by shorting the output to ground. Thus, the maximum positive excursions of the applied input signal $e$ are restricted to a predetermined reference level, i.e., they are clamped to 0 volt. Where the applied signal has lost its DC component through capacitive coupling, or otherwise, the clamp circuit of FIG. 1 will reinsert a DC component equal to the signal's average value; hence the dual designation as a DC restorer. Unfortunately, however, due to the nonlinear characteristics exhibited by typical diodes, the conventional clamp circuit does not ideally clamp the applied signal but, rather, introduces nonlinear perturbations.

FIG. 2 illustrates an improved clamping circuit, in accordance with the principles of this invention, which overcomes the limitations of conventional clamping circuits and, in addition, has numerous other advantages. An input signal, depicted by waveform $e$, which is assumed to have zero average value, is applied to terminal 11 and to a high gain, direct coupled amplifier, e.g., an operational amplifier 12, via input resistor R. Operational amplifier 12 is shunted by two circuit branches, each comprising the serial connection of a resistor and a diode, $R_1$, $D_1$, and $R_2$, $D_2$, respectively. A capacitor C is connected between one of the output terminals, illustratively terminal 14, and ground. The effect of the extremely high open loop gain of amplifier 12 in conjunction with the shunt feedback arrangement is to produce an extremely linear characteristic for the diodes utilized. A more detailed discussion of this property may be found in Pat. 3,187,325 issued to F. D. Waldhauer on June 1, 1965.

Assuming, that prior to a predetermined reference time the input voltage $e$ is equal to zero, and that no previous charge exists on the capacitor, the application of the input voltage to terminal 11 will cause a corresponding change in potential at output terminal 15 of operational amplifier 12. If it is further assumed that input voltage $e$ proceeds in a negative direction at the reference time, the potential at point 15 will, in response thereto, become more positive. Diode $D_1$ will thus be cut off and diode $D_2$ turned on, therefore charging capacitor C to a voltage $e_1$, proportional to the maximum negative excursion $e_{max}$ of the input signal. Mathematically, the voltage across capacitor C may be expressed as:

$$e_1=\frac{-R_2}{R}e_{max.} \qquad (1)$$

When capacitor C is charged to the above value, diode $D_2$ turns off and opens circuits the path between terminal 15 and capacitor C. Since resistor $R_2$ is typically a relatively large resistor, for example, 50,000 ohms, capacitor C is prevented from discharging. Accordingly, capacitor C acts as a supplemental fixed signal source at the input of operational amplifier 12. Simultaneously with the cutoff of diode $D_2$, diode $D_1$ is turned on, and stays on, until either a new negative peak is attained by the input signal or until the stored voltage $e_1$ has sufficiently decayed. The output signal $e_2$ at terminal 13 is thus:

$$e_2=\frac{-R_1}{R}e-\frac{R_1}{R_2}e_1 \qquad (2)$$

Substituting Eq. 1 into Eq. 2, it may be found that voltage $e_2$ is equal to:

$$e_2=\frac{-R_1}{R}(e-e_{max.}) \qquad (3)$$

Returning for the moment to the conventional clamp circuit of FIG. 1, it is noted that the output voltage is equal to:

$$e_2=e-e_1 \qquad (4)$$

where $e_1$ is equal to the maximum excursion $e_{max}$ of the applied signal.

Thus, the output signal appearing at terminal 13 of FIG. 2 is exactly proportional to the clamped output signal of a conventional clamp circuit. It is noted from Eq. 3 that the clamp circuit of the instant invention not only clamps the input signal but also inverts it and amplifies it by a factor $$\left|\frac{R_1}{R}\right|$$

If it is desired to clamp on the positive peaks of the input signal, capacitor C may be connected between terminal 13 and ground and the desired output obtained at terminal 14.

A number of other properties are exhibited by the invention in addition to the aforementioned linearization of the diode characteristics and amplification of the clamped signal. For example, due to the virtual ground which exists at the input of an operational amplifier, the input impedance of the circuit of FIG. 2 is fixed and equal to input resistor R. In addition, the output impedance at terminal 13 is extremely low, except during the relatively short time when capacitor C is charging and diode $D_1$ is open circuited; accordingly, resistive loading has no effect on the circuit as long as the output current capabilities of operational amplifier 12 are not exceeded. In contrast, the conventional clamp circuit of FIG. 1 has a time-varying input impedance and its operation is drastically affected by the presence of a load impedance.

As shown in Eq. 1 above, the DC voltage $e_1$ appearing at terminal 14, i.e., the capacitor voltage, is proportional to the peak amplitude of the applied signal $e$ which, equivalently, is the average value of the output voltage $e_2$. The output voltage $e_2$, furthermore, is independent of the capacitor voltage $e_1$ in that resistor $R_2$ and capacitor C may be varied without affecting the output voltage, subject to the limitation that the product $R_2C$ remain high; this is apparent from Eq. 3 above. Thus, the gain from terminal 11 to terminal 13 may be adjusted independently of the gain from terminal 11 to terminal 14. Of course, loading of capacitor C will change the time constant of the circuit thereby affecting the clamping operation of the circuit.

For illustrative purposes only, and not to be considered a limitation of the scope and breadth of this invention, the following values for the elements of FIG. 2 were found to provide satisfactory performance: R=10,000 ohms, $R_1=R_2=$50,000 ohms, and C=1 microfarad. Conventional diodes and integrated circuit operational amplifiers may be used, if so desired.

It is well known that in switching a diode "dead time," i.e., a time lag, is exhibited between the application of a signal and response by the diode, due to its semi-conductor composition and the limited bandwidth of connected circuits. This disadvantage manifests itself, particularly, when high speed operation is required and it is overcome in the circuit of FIG. 3 wherein transistors $T_1$ and $T_2$ have been substituted, respectively, for the diodes $D_1$ and $D_2$ of FIG. 2. The base-emitter junction of each transistor, as is well known to those skilled in the art, provides the desired diode characteristic. In addition, to speed up the switching time and thereby substantially reduce any dead time exhibited by the transistor junctions, two capacitors 16 and 17 are used to cross-couple the transistors. That is, the collector of each transistor is capacitatively coupled to the base of the other transistor. Thus, as one transistor starts to turn off, its collector potential increases, thereby aiding the turn-on potential at the base of the other transistor. Capacitive coupling from only one collector to the base of the other transistor, as opposed to cross-coupling, is also beneficial.

FIG. 4 illustrates a further embodiment of the instant invention wherein the circuit of FIG. 2 has been modified to function not only as a clamp but also as a driver for a connected stage (not shown), for example, the grid of a cathode ray tube. Generally, in conventional video systems, the video signal is first clamped and then amplified, by an additional stage, prior to its application to the cathode ray tube or other coupled circuit. In the circuit of FIG. 4, no auxiliary amplification stage is required. Again, similar to the circuit of FIG. 3, the base-emitter junctions of two transistors, $T_1$ and $T_2$, perform the function of diodes $D_1$ and $D_2$ of the circuit of FIG. 2. However, in this embodiment, the clamped signal is obtained at collector terminal 23 of transistor $T_1$. Accordingly, advantage is taken of the amplification properties of transistor $T_1$. A gain equal to $R_{21}/R_1$ is provided by transistor $T_1$ in addition to the gain of $R_1/R$ provided by the operational amplifier clamp. Mathematically, $$e_2=\frac{R_{21}}{R_1}\cdot e_1 \text{ and } e_1=\frac{R_1}{R}e \text{ so } e_2=\frac{R_{21}}{R}\cdot e$$

More accurately, the gain factor of transistor $T_1$ should be multiplied by a term equal to the ratio of the sum of the values of resistor $R_1$ and resistor 24 divided by the value of resistor 24.

Furthermore, since the operational amplifier need only deliver the base current requirements of transistors $T_1$ or $T_2$, its output capability is considerably relaxed.

As mentioned above, output terminal 14 of the circuit of FIG. 2 may not be loaded without affecting the time constant and hence clamping operation of the circuit. The circuit of FIG. 5 overcomes this disadvantage. Since the capacitor voltage is proportional to the average value of the clamped signal, it is advantageous, as will be discussed hereinafter, to be able to load the capacitor terminal. In FIG. 5, the circuit of FIG. 4 has been modified by the addition of transistor $T_3$ and collector resistor 25, in the shunt feedback path, between capacitor C and resistor $R_2$. Of course, the same modification may be made in the circuit of FIG. 2. The output signal appearing at terminal 26, or the emitter of transistor $T_3$, is an amplified version of the stored voltage on capacitor C. In addition, the input impedance of transistor $T_3$, seen by capacitor C, is relatively high; thus, the value of $R_2$ or C may be decreased while still maintaining the required time constant. Furthermore the presence of $T_3$ in the shunt feedback branch does not affect the clamping operation of the circuit.

As shown in Eq. 3, the magnitude of the clamped output voltage appearing at terminal 13 of FIG. 2 is inversely proportional to the value of input resistor R. The circuit of FIG. 6 turns this property to account to achieve automatic gain control (AGC) of the clamped output signal. Since the voltage $e_1$ appearing at terminal 14 is representative of the average value of the input signal, after clamping, it may be used as a control voltage to maintain the average value of the clamped output signal $e_2$ constant, over a relatively wide range of input signal variations. Thus, in accordance with the principles of this invention, a voltage controlled variable resistor, e.g., field effect transistor (FET) 27 responsive to voltage $e_1$, is substituted for resistor R of FIG. 2. The field effect transistor has the advantage of not drawing any current from its driving source, thus not loading capacitor C. If a control device other than a FET is utilized, loading of capacitor C may be obviated by the use of transistor $T_3$, shown in FIG. 5, as discussed above.

The resistance presented by FET 27 increases with the driving voltage $e_1$; thus, the FET is ideally suited to the instant application. An increase in input signal level increases voltage $e_1$ which, in turn, increases the resistance presented by FET 27, which, in turn decreases the gain of the amplifier. As shown by Eq. 1 the value of resistor $R_2$ should be made relatively large to increase the gain of the AGC loop. Fortuitously, it is noted from Eq. 3 that an increase in resistor $R_2$ has no effect on the magnitude of the clamped output signal $e_2$. Furthermore, increasing resistor $R_2$ allows a decrease in the value of capacitor C while maintaining the RC time constant invariable.

Where it is desired to obtain more accurate and reliable automatic gain control, an auxiliary reference voltage as shown in the circuit of FIG. 7 may be utilized. A differential amplifier 28, responsive to the difference between voltage $e_1$, across capacitor C, and a reference voltage generated by source 29, is inserted in the AGC feedback loop of FIG. 6. The difference between the average value of the clamped signal and the reference voltage of source 29 thus controls FET 27. Otherwise, the operation of the circuit is identical to that of FIG. 6.

If so desired, diodes $D_1$ and $D_2$ of FIG. 2 may be replaced by a synchronous switch as shown in FIG. 8. Switch $S_1$ may be any one of the many electronic equivalents of the single-pole double-throw switch illustrated. Responsive to a control signal designated as sync, switch $S_1$ functions as diodes $D_1$ and $D_2$ at predetermined time intervals. Accordingly, a synchronous clamp circuit is realized which, for the same reasons stated above, compensates for nonlinearity or other undesirable behavior exhibited by switch $S_1$.

It is to be understood that the embodiments shown and described herein are illustrative of the principles of this invention only and that further modifications of this invention may be implemented by those skilled in the art without departing from the scope and spirit of the invention. For example, the features of the invention disclosed herein, though described as separate embodiments for illustrative purposes, may be combined in a unitary circuit which simultaneously functions as a clamp, amplifier and AGC circuit.

What is claimed is:

1. A clamp circuit comprising:
a high gain, direct coupled amplifier having an input terminal and an output terminal,
a first circuit branch, comprising the serial connection of a first resistor and first unidirectional conducting means, connected between said amplifier input and output terminals,
a second circuit branch, comprising the serial connection of a second resistor and second unidirectional conducting means, connected between said amplifier input and output terminals,
means for applying a signal to be clamped to the input terminal of said amplifier,
capacitor means, having a first terminal connected to the junction of said first resistor and said first unidirectional conducting means and a second terminal connected to a source of constant potential, for storing a signal developed at said first terminal junction proportional to the peak amplitude of said applied signal, and
means for yielding a signal proportional to a clamped facsimile of said applied signal connected to the junction of said second resistor and said second unidirectional conducting means.

2. The clamp circuit as defined in claim 1 wherein said means for applying a signal to said amplifier comprises a voltage controlled variable resistor connected to said amplifier input terminal, the control terminal of said controlled resistor connected to said first terminal capacitor junction, for effecting automatic gain control of said clamped signal.

3. The clamp circuit as defined in claim 1 wherein said means for applying a signal to said amplifier comprises a voltage controlled variable resistor connected to said amplifier input terminal, the control terminal of said controlled resistor connected to the output terminal of means for developing a difference signal, a first input terminal of said difference signal means connected to said first terminal capacitor junction and a second input terminal of said difference signal means connected to a source of a predetermined reference signal.

4. The clamp circuit defined in claim 1 further comprising a transistor connected between said first resistor and the first terminal junction of said capacitor and said first unidirectional conducting means.

5. The clamp circuit as defined in claim 2 wherein said voltage controlled variable resistor comprises a field effect transistor.

6. The clamp circuit as defined in claim 3 wherein said voltage control variable resistor comprises a field effect transistor.

7. The clamp circuit defined in claim 1 wherein said first and second unidirectional conducting means each comprise first and second diode means, respectively.

8. The clamp circuit defined in claim 1 wherein said first and second unidirectional conducting means each comprise first and second transistor means, respectively.

9. The clamp circuit defined by claim 8 wherein said first and second transistors are capacitively coupled.

10. The clamp circuit defined in claim 8 wherein said means for yielding a signal comprises means for sensing an amplified, clamped reproduction of said applied signal at the collector of said second transistor.

11. The clamp circuit defined in claim 1 wherein said high gain, direct coupled amplifier comprises operational amplifier means.

References Cited

UNITED STATES PATENTS

| | | | |
|---|---|---|---|
| 3,140,408 | 7/1964 | May | 328—143 X |
| 3,346,697 | 10/1967 | Kitsopoulos | 330—103 X |

FOREIGN PATENTS

| | | |
|---|---|---|
| 1,003,190 | 9/1965 | Great Britain. |
| 1,254,789 | 1/1961 | France. |

NATHAN KAUFMAN, Primary Examiner

U.S. Cl. X.R.

330—24, 28, 38, 51, 110, 138